(12) United States Patent
Mollard et al.

(10) Patent No.: US 9,450,013 B2
(45) Date of Patent: *Sep. 20, 2016

(54) LOW NOISE CDHGTE PHOTODIODE ARRAY

(71) Applicant: Commissariat a L'Energie Atomique et aux Energies Alternatives, Paris (FR)

(72) Inventors: Laurent Mollard, Claix (FR); Francois Boulard, Grenoble (FR); Guillaume Bourgeois, Grenoble (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 0 days.

This patent is subject to a terminal disclaimer.

(21) Appl. No.: 14/795,129

(22) Filed: Jul. 9, 2015

(65) Prior Publication Data

US 2016/0020241 A1   Jan. 21, 2016

(30) Foreign Application Priority Data

Jul. 16, 2014   (FR) ...................... 14 01585

(51) Int. Cl.

| H01L 27/146 | (2006.01) |
|---|---|
| H01L 31/103 | (2006.01) |
| H01L 31/18 | (2006.01) |
| H01L 27/144 | (2006.01) |

(52) U.S. Cl.
CPC ..... *H01L 27/14643* (2013.01); *H01L 27/1443* (2013.01); *H01L 27/1446* (2013.01); *H01L 27/1463* (2013.01); *H01L 27/14607* (2013.01); *H01L 27/14696* (2013.01); *H01L 27/14698* (2013.01); *H01L 31/1032* (2013.01); *H01L 31/1832* (2013.01)

(58) Field of Classification Search
CPC .................................................. H01L 27/14643
USPC .......................................................... 257/443
See application file for complete search history.

(56) References Cited

U.S. PATENT DOCUMENTS

| 4,961,098 A | 10/1990 | Rosbeck et al. |
|---|---|---|
| 5,880,510 A | 3/1999 | Cockrum et al. |
| 2014/0319580 A1 | 10/2014 | Mollard et al. |
| 2014/0339570 A1 | 11/2014 | Mollard et al. |
| 2014/0346539 A1 | 11/2014 | Mollard et al. |

OTHER PUBLICATIONS

U.S. Appl. No. 14/705,078, filed May 6, 2015, Laurent Mollard et al.
U.S. Appl. No. 14/686,084, filed Apr. 14, 2015, Laurent Mollard et al.

(Continued)

*Primary Examiner* — Anthony Ho
(74) *Attorney, Agent, or Firm* — Oblon, McClelland, Maier & Neustadt, L.L.P

(57) ABSTRACT

A planar photodiode array including a useful layer made of $Cd_xHg_{1-x}Te$. The useful layer includes at least two superimposed doped layers, each interface between two doped layers forming a single PN junction; the useful layer has at least one separation region, extending from the upper face of the useful layer, and separating at least two useful volumes while going through the PN junction; and beyond a predetermined depth in the useful layer, the average cadmium concentration in the useful volumes is less than the average cadmium concentration in the separation region.

8 Claims, 3 Drawing Sheets

(56) References Cited

OTHER PUBLICATIONS

U.S. Appl. No. 14/402,020, filed Nov. 18, 2014, Francis Boulard et al.

U.S. Appl. No. 14/420,814, filed Feb. 10, 2015, Francis Boulard et al.

French Preliminary Search Report issued Apr. 30, 2015 in French Application 14 01585, filed on Jul. 16, 2014 (with English Translation of Categories of Cited References).

LOW NOISE CDHGTE PHOTODIODE ARRAY

TECHNICAL FIELD

The present invention relates to the field of CdHgTe infrared photodiodes, used to detect infrared radiation.

STATE OF THE PRIOR ART

Different types of photodiode arrays are known from the prior art, in particular photodiode arrays formed in a layer of semi-conductor material made of an alloy of cadmium, mercury and tellurium $Cd_xHg_{1-x}Te$, with x a real number comprised between 0 and 1, the bounds being excluded. Throughout the text, this layer of semi-conductor material is named "useful layer".

These photodiodes are used for example in the space field, for the detection of infrared radiation, particularly middle wave infrared (MWIR, corresponding to wavelengths comprised between 4 µm and 5 µm at 80 K) and long wave infrared (LWIR, corresponding to wavelengths greater than 8 µm at 80 K).

In a variant, these photodiodes may also be used for the detection of infrared radiation designated SWIR (small wave infrared, corresponding to wavelengths between 2 and 3 µm at 80 K), and infrared radiation designated VLWIR (very long wave infrared, corresponding to wavelengths greater than 14 µm at 80 K).

For example rectangular arrays grouping together 640× 512 photodiodes are formed, with a pitch of 15 µm (width of a photodiode).

A photodiode generally has a current designated dark current. Dark current is the residual electric current of a photodetector in the absence of illuminance.

A photodiode with mesa structure is a non-planar photodiode, that is to say having topological variations on the upper side of the useful layer, on a face designated useful face. "Mesa" designates each emerging part, between the trenches. The technological formation of a photodiode with mesa structure thus requires the creation of trenches in the useful layer. In particular, a photodiode array having a mesa structure is formed from a stack of two doped layers, the interface between the two doped layers forming a PN junction. Trenches, known as "furrows", are then etched in the stack of doped layers. This etching makes it possible to separate pads each having a PN junction and each corresponding to a photodiode. In this type of technology, the etching of the trenches can lead to the presence of deficiencies increasing the dark current. In particular, the etching of the stack of doped layers creates material deficiencies at the etched interfaces. These material deficiencies lead to spontaneous creations of electron-hole pairs. An electron-hole pair corresponds to the appearance in the useful layer of a minority carrier (the electron or the hole). When the minority carrier passes through the PN junction, an electric current which does not correspond to the absorption of an electromagnetic radiation is measured. The term dark current is used for this reason. An increase of the dark current prevents, for example, detecting very weak radiations in the infrared.

An objective of the present invention is to propose a $Cd_xHg_{1-x}Te$ photodiode array formed from a stack of doped layers, and having a reduced dark current.

Another aim of the present invention is to propose a method of manufacturing such a photodiode array.

DESCRIPTION OF THE INVENTION

This objective is attained with a photodiode array comprising a useful layer made of a semi-conductor alloy of cadmium, mercury and tellurium of $Cd_xHg_{1-x}Te$ type, the useful layer having a lower face and an upper face on the side opposite to the lower face.

According to the invention, the photodiode array has the following characteristics:
- the useful layer comprises at least two superimposed doped layers, each interface between two adjacent doped layers forming a PN junction;
- the useful layer has at least one region designated separation region, extending from the upper face of the useful layer to its lower face while passing through said PN junction, the separation region separating at least two volumes designated useful volumes which extend into the useful layer as deeply as the separation region; and
- beyond a predetermined depth in the useful layer, the average cadmium concentration in the separation region is greater than the average cadmium concentration in the useful volumes.

The photodiode array thus forms a planar array, in which a PN junction extends over the whole extent of the useful layer.

This PN junction is formed from a single piece. In other words, each interface between two superimposed doped layers forms a single PN junction. This single PN junction is crossed through by the separation regions which form several photodiodes, from this single PN junction. Thus, at least two photodiodes, or pixels of the array, share the same PN junction.

Advantageously, the average cadmium concentration in the separation region is greater than the average cadmium concentration in the remainder of the useful layer.

The useful layer may consist of two doped layers each having a doping of different nature.

In a variant, the useful layer may consist of three doped layers forming together two PN junctions, two doped layers having a doping of same nature flanking a median doped layer having a doping of different nature, and the separation region passing through the two PN junctions.

Preferably, the separation region has a cadmium gradient decreasing from the upper face of the useful layer and in the direction of its lower face.

The separation region may be separated from the lower face of the useful layer by at least one portion of said useful layer.

The useful volumes are advantageously spread out in the useful layer according to a regular lattice pattern.

In particular, the useful volumes may be spread out in the useful layer according to a square lattice pattern, and separated from each other by a single separation region.

According to an advantageous embodiment, the photodiode array according to the invention comprises at least one over-doped zone, situated in a region formed by the intersection between a separation region and the doped layer situated on the side of the upper face of the useful layer, designated upper doped layer, the over-doped zone having a doping of type opposite to that of said upper doped layer.

The invention also relates to a method of manufacturing such a photodiode array. The method according to the invention comprises the following steps:

formation of a useful layer made of a cadmium, mercury and tellurium semi-conductor alloy of $Cd_xHg_{1-x}Te$ type, comprising at least one PN junction situated between two superimposed doped layers of the useful layer;

formation, on the upper face of the useful layer, of a layer designated structured layer having at least one through opening, and having a cadmium concentration greater than the average cadmium concentration of the useful layer;

annealing of the useful layer covered with the structured layer, causing a diffusion of cadmium atoms of the structured layer, from the structured layer to the useful layer, thereby forming the at least one separation region.

Preferably, the through openings are spread out in the structured layer according to a regular lattice pattern.

Said steps of formation of a structured layer, and annealing, form advantageously a manufacturing cycle, and at least two manufacturing cycles are implemented.

The annealing may be carried out at a temperature comprised between 100° C. and 500° C.

The annealing may be carried out for a duration comprised between 1 hour and 100 hours.

The method according to the invention may comprise a doping step, so as to form at least one over-doped zone, situated in a region formed by the intersection between a separation region and the doped layer situated on the side of the upper face of the useful layer, designated upper doped layer, the over-doped zone having a doping of type opposite to that of said upper doped layer.

BRIEF DESCRIPTION OF THE DRAWINGS

The present invention will be better understood on reading the description of embodiment examples given purely for indicative purposes and in no way limiting, and by referring to the appended drawings in which.

DETAILED DESCRIPTION OF PARTICULAR EMBODIMENTS

Figure 1:
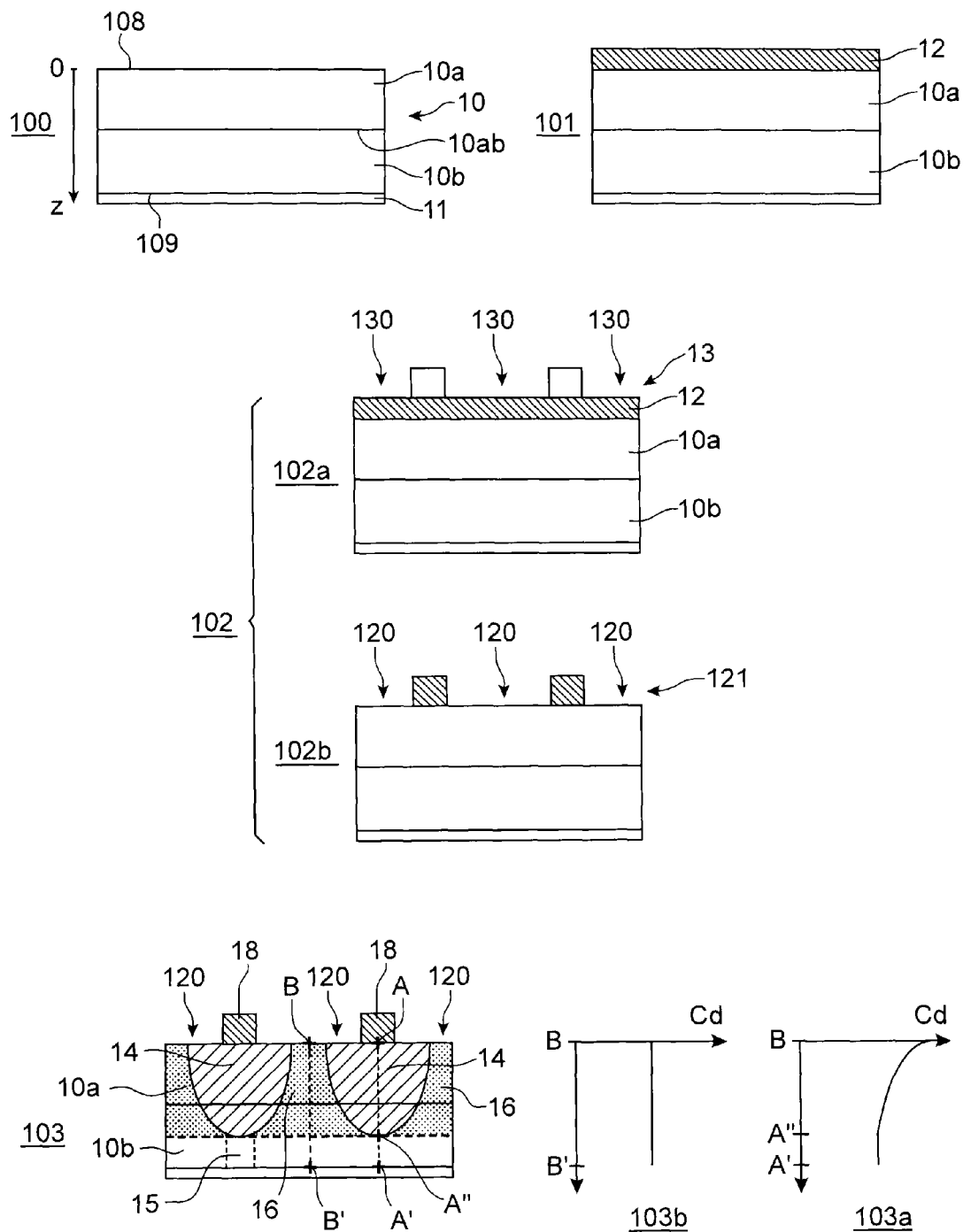
FIG. 1 illustrates in a schematic manner a first embodiment of the method according to the invention.

FIG. 1 illustrates, in a schematic manner, the steps of a method according to the invention of manufacturing a photodiode array. The views of FIG. 1 are sectional views.

The method of FIG. 1 implements a useful layer 10 of semi-conductor material made of an alloy of cadmium, mercury and tellurium $Cd_xHg_{1-x}Te$, with x a real number comprised between 0 and 1, the bounds being excluded. In particular, x is less than 0.5. Typically x is comprised between 0.2 and 0.4. In the example of FIG. 1, the cadmium concentration in the useful layer 10 is constant in space.

For example, it is sought to detect a radiation in the middle wave infrared, designated MWIR, which corresponds to a cadmium concentration defined by x=0.3. In a variant, it is sought to detect a radiation in the long wave infrared, designated LWIR, which corresponds to a cadmium concentration defined by x=0.22.

It could also be wished to detect wavelengths in the SWIR or the VLWIR.

This useful layer 10 is formed on a substrate 11, for example a substrate made of an alloy of cadmium, zinc, tellurium. Such an alloy offers a very advantageous lattice tuning of the material of the useful layer 10 with the substrate 11. The substrate 11 is transparent to the wavelengths that it is wished to detect. According to a variant not represented, the substrate is separated from the useful layer before, during or after the implementation of the method according to the invention. Thus, the array according to the invention does not necessarily comprise a substrate.

The useful layer 10 typically has a thickness comprised between 1 µm and 20 µm, for example 15 µm. The substrate 11 has a thickness of the order of 500 µm. For reasons of clarity of the figures, the thickness of the substrate 11 is under-dimensioned in the figures.

The useful layer has for example a parallelepiped shape, particularly a parallelepiped rectangle. In this useful layer a z axis starting from the face 108 is defined, connecting the faces 108 and 109, and defining the depth axis. The face 109 is a lower face (here in contact with the substrate 11). The face 108 is an upper face, on the side opposite to the lower face 109.

Step 100:

During a first step 100, a useful layer 10 is formed, having a PN junction 10ab which extends along a plane, over the whole extent of the useful layer 10. It is in particular a plane orthogonal to the z axis.

The PN junction 10ab is here formed by the interface between the two superimposed doped layers 10a and 10b, each having an N or P doping of different nature. For example, the doped layer 10a is P doped, and the doped layer 10b is N doped. The doped layers 10a and 10b together form the useful layer 10, and thus both extend over the whole extent of the useful layer. The layer 10a may be designated upper doped layer. The layer 10b may be designated lower doped layer.

Throughout the text, a layer is designated P doped when it has an excess of "holes", or in other words a deficiency of electrons (minority carriers). A layer is designated N doped when it has an excess of electrons, or in other words a deficiency of holes (minority carriers). Throughout the text, the nature of the doping of a doped layer designates the nature of the majority carriers in said layer. A type of doping (N or P) is also referred to.

In the example illustrated in FIG. 1, the doped layers 10a and 10b are formed during the growth of the useful layer 10. For example, a first layer which contains N doping atoms such as indium atoms is firstly deposited on the substrate. On this first layer is then deposited a second layer which contains P doping atoms such as arsenic atoms. These two layers form the useful layer 10. An annealing at around 400° C. is then carried out to activate the P dopants. This annealing creates mercury vacancies throughout the useful layer 10. A strongly P doped layer (thanks to the arsenic atoms) is thus obtained, above a weakly P doped layer (due to mercury vacancies). An annealing at around 220° C. under saturating mercury pressure is then carried out to fill the mercury vacancies. A strongly P doped layer 10a above an N doped layer 10b is thus obtained.

For all of the necessary annealings, those skilled in the art will know how to carry out annealings in pressure and temperature conditions that limit the degradation of the material.

In a variant, the doped layer 10a is N doped with indium atoms at growth, and the doped layer 10b is P doped. To do so, for example, a first layer which contains arsenic doping atoms is deposited on the substrate. A second layer which contains N doping atoms such as indium doping atoms is then deposited on the first layer. An annealing at around 400° C. is then carried out to activate the P dopants. This annealing creates mercury vacancies throughout the useful layer 10. A strongly P doped layer (thanks to the arsenic atoms) is thereby obtained, below a weakly P doped layer (due to the mercury vacancies). An annealing at around 220° C. under saturating mercury pressure is then carried out to fill the mercury vacancies. An N doped layer 10a above a P doped layer 10b is thus obtained.

It is also possible to carry out the P doping of the layer 10b by its intrinsic impurities such as mercury vacancies. To do so, the concentration of mercury vacancies must be controlled by suitable annealings and said annealing must not affect the doping of the N layer.

The doping density (of indium atoms) in the N layer is for example $1.10^{16}$ atoms/cm$^3$, and the doping density (of arsenic atoms) in the P layer is equal to or greater than $10^{18}$ atoms/cm$^3$.

The depositions of layers then forming the doped layers 10a and 10b are advantageously carried out by a technique known as molecular beam epitaxy. Molecular beam epitaxy is a crystal growth technique in which the elements to be deposited on a support are evaporated then are going to be deposited on this support. In a variant, a liquid phase epitaxy technique could be used. Liquid phase epitaxy is a crystal growth technique in which the support is placed in contact with a liquid phase of a desired element which crystallises on the support. Any other technique of deposition of a crystalline layer on a support could also be envisaged, for example chemical vapour deposition.

Step 101:

During step 101, on the upper face 108 of the useful layer 10 is deposited a layer designated reservoir layer 12 of which one of the elements is cadmium and having a cadmium concentration greater than the average cadmium concentration of the useful layer 10.

The reservoir layer 12 is made of a binary, ternary, or quaternary material, or even more. This material advantageously comprises elements belonging to columns II and VI of the periodic table. It may be for example and in a non-limiting manner CdS, CdSe, CdTe, CdZnSe, CdMnSSe, etc.

The reservoir layer 12 has a thickness of the order of a micrometer, for example between 0.1 µm and 10 µm, in particular 1 µm.

The deposition of the reservoir layer 12 is carried out by any known thin film deposition technique.

The reservoir layer 12 thus forms a uniform layer which covers the whole of the upper face 108 of the useful layer 10.

Step 102:

The reservoir layer 12 is then etched so as to form therein through openings 120. This step is called structuring, or texturing, of the reservoir layer 12. The reservoir layer after structuring forms a layer designated structured layer 121. The structured layer 121 thus has the same cadmium concentration as the reservoir layer 12. "Through opening" designates an opening passing through a layer from one end to the other, in the sense of the thickness.

The formation of the structured layer 121 preferably has a step of physical or chemical etching.

Step 102 is broken down for example into two steps 102a and 102b.

Step 102a:

In a first step 102a, a resin layer is deposited on the reservoir layer 12, then through openings 130 are etched in this resin. It preferentially involves an etching by photolithography. A mask of resin 13, situated on the reservoir layer 12, is thereby formed.

Step 102b:

In a second step 102b, the reservoir layer 12 is etched through the resin mask 13. Thus, the reservoir layer 12 is etched uniquely at the sites not covered by the resin.

The etching is advantageously a chemical etching, typically a chemical etching using a bromine solution. The etching depth is adjusted by adjusting the duration of the chemical etching. In practice, the reservoir layer has an appearance different from that of the useful layer, which is why the moment as from when the chemical etching can be stopped can be optically pinpointed.

Any other structuring method may also be envisaged such as a selective chemical etching between the reservoir layer 12 rich in cadmium, and the useful layer made of cadmium, mercury, tellurium alloy. A selective non-chemical etching or non-selective non-chemical etching may also be envisaged providing that it does not create additional damaging deficiencies in the useful layer.

The following steps:
deposition 101, on the upper face 108 of the useful layer, of a reservoir layer 12 having a cadmium concentration greater than the average cadmium concentration of the useful layer 10; and
etching 102 of at least one through opening 120 in the reservoir layer, thereby forming a layer designated structured layer 121;
together form a step of forming, on said upper face 108, a structured layer 121 having at least one through opening 120, and a cadmium concentration greater than the average cadmium concentration in the useful layer 10.

It may also be envisaged to form the structured layer 121 by "lift-off" technology. This involves for example depositing a structured resin layer on the upper face 108, and covering the whole by the reservoir layer 12. The reservoir layer is thus deposited on the resin, there where the resin is present, and on the useful layer 10 at the level of the through openings in the resin. On removing the resin, the structured layer 121 is obtained.

Step 103:

An annealing adapted to the assembly formed by the useful layer 10 and the structured layer 121 is then carried out. This annealing will be for example carried out at a temperature comprised between 100° C. and 500° C., preferably between 300° C. and 500° C., and for a duration which can range from several minutes to several hours, for example between 1 h and 100 h, for example between 1 h and 40 h. In the example represented in FIG. 1, the annealing corresponds to a heating at 430° for 50 h.

The layer corresponding to the structured layer 121 after annealing is called remaining layer 18. It could be provided to eliminate the remaining layer 18. For example a planarization method could be used.

During this annealing, the cadmium atoms of the structured layer 121 are then going to diffuse to the useful layer 10. It is thus possible to speak of a diffusion annealing. This annealing conserves the quality of the crystalline structure of the useful layer.

In this way are formed, under the full portions of the structured layer 121, separation regions 14 each having a cadmium concentration gradient decreasing from the upper face 108 to the lower face 109 of the useful layer. The full portions of the structured layer 121 designate the portions surrounding the through openings, that is to say if need be the portions of reservoir layer 12 remaining after step 102.

Throughout the text, a constant in space cadmium concentration does not define a concentration gradient.

The concentration gradient is particularly a continuous gradient, without sudden break in slope.

The separation regions 14 separate at least two volumes designated useful volumes 16, which extend into the useful layer 10 as deeply as said separation regions 14. For reasons of legibility of FIG. 1, the useful volumes are represented by surfaces in dotted lines.

The separation regions 14 extend into the useful layer 10 from the upper face 108 up to inside the lower doped layer 10b, that is to say up to inside the doped layer comprising the lower face of the useful layer. If need be, this doped layer may be defined as being the doped layer the closest to the substrate 11. The separation regions 14 thus pass through the PN junction 10ab, if need be the junction 10ab the closest to the lower face 109 of the useful layer. These separation regions 14 extend for example over at least one third of the thickness of the lower doped layer 10b, preferably at least half. Preferably, each separation region 14 is separated from the lower face 109 of the useful layer by a portion 15 of the useful layer. It is also possible that at least one separation region 14 passes through the whole of the two doped layers 10a and 10b. In this respect, the modulation transfer function (MTF) of the diodes is optimised, in addition to the advantages which will be detailed hereafter.

Since cadmium atoms have diffused into the separation regions 14, the average cadmium concentration in these regions is greater than the average cadmium concentration in at least one adjacent useful volume 16.

For the same reason, the average cadmium concentration in these regions 14 is greater than the average cadmium concentration in the remainder of the useful layer. In particular, the average cadmium concentration in the regions 14 is greater than the average cadmium concentration in a region of the useful layer intended to form an absorption region of the useful layer, in which photons at the wavelength that it is wished to detect are going to form minority carriers.

The criterion could also be retained according to which, beyond a predetermined depth (here z=0) in the useful layer 10, the average cadmium concentration in the separation regions 14 is greater than the average cadmium concentration in the useful volumes 16. Unless stated otherwise, the term "concentration" designates a volume concentration.

The following criterion could also be used, in considering the surfaces in the useful layer, parallel to the upper face 108, and defined by a depth z in the useful layer. Once past a predetermined depth in the useful layer 10, the intersection of such a surface with the regions 14 has an average surface cadmium concentration greater than the average surface cadmium concentration of the intersection of this same surface with the remainder of the useful layer. In the example illustrated in FIG. 1, the designated predetermined depth is less than the thickness of the useful layer 10 from the upper face 108 up to the PN junction 10ab. In particular, the designated predetermined depth is defined by z=0.

The regions 14 all emerge on the upper face 108.

On the right are represented graphs 103a and 103b representing a cadmium concentration Cd in the useful layer (abscissa axis) as a function of the depth in the useful layer (ordinate axis).

The graph 103b corresponds to a section in the useful layer along the axis BB' going through a useful volume 16. It may clearly be seen that the cadmium concentration then has a continuous value, and corresponding to the initial cadmium concentration of the useful layer.

The graph 103a corresponds to a section in the useful layer along the axis AA' passing through a separation region 14. The cadmium concentration has a profile that decreases progressively from the upper face 108 and in the direction of the lower face 109. For example, this gradient takes a maximum value defined by x=0.5 in $Cd_xHg_{1-x}Te$, and a minimum value defined by x=0.22 and corresponding to the initial cadmium concentration of the useful layer. The gradient, and thus the separation region 14, extends into the useful layer up to A". The point A" is situated at around half of the thickness of the doped layer 10b, for example at a distance of 1 μm from the lower face 109.

The diffusion of atoms, particularly cadmium atoms, may be approximated by a Fick type standard diffusion law:

$$n(z, t) = \frac{1}{\sqrt{\pi Dt}} e^{-\frac{z^2}{4Dt}},$$

with
  n(z, t) the volume concentration of atoms of a given species as a function of the depth z and the time t;
  t the duration of the annealing;
  D the diffusion coefficient of the atom, with $$D = D_0 e^{-\frac{Ea}{kT}},$$

T the annealing temperature and Ea the diffusion activation energy (quantity of energy required to initiate the atom diffusion process).

In fact it is verified that the cadmium concentration gradient follows a decreasing curve starting from the upper face 108 (point A) and in the direction of the lower face 109 (up to point A"), and having a substantially exponential profile. The separation regions 14 all emerge on the upper face 108.

As a function of the desired characteristics of the separation region 14, particularly its depth and the profile of the concentration gradient, those skilled in the art will know how to adapt the temperature and the duration of the annealing. They could also work on the shape of the structured layer 121 (size and shape of the through openings, spacing between the through openings), and its thickness.

Several cycles each comprising the steps of forming a structured layer 121, and annealing could be provided. Between two cycles, the layer corresponding, after annealing, to the structured layer formed previously is advantageously eliminated. Each of the cycles may implement a structured layer of different shape.

In the example represented in FIG. 1, the PN junction 10ab is formed before the annealing step 103.

In a variant, the PN junction 10ab could be provided to be formed after the annealing step 103. For example, the upper doped layer 10a is then N doped with indium atoms. The indium atoms are activated at growth, and dope the layer 10a according to an N type doping.

According to another variant, a single annealing realises both the diffusion of cadmium, and the activation of a P dopant. In this case, it is possible for example to form at growth an upper layer 10a comprising P doping elements still not activated. These P doping elements will be activated at the same time as the cadmium will diffuse from the structured layer to the active layer.

Conventional steps of installation of electrical contact elements in contact with the useful layer could then be carried out. These electrical contact elements make it possible to electrically bias the photodiodes. For example a contact is provided for each photodiode, electrically connected to the upper doped layer 10a, and a contact common to all the photodiodes is also provided, electrically connected to the lower doped layer 10b.

It has been observed that in a semi-conductor material made of $Cd_xHg_{1-x}Te$, the band gap, also called "gap", depends on the cadmium concentration. The higher this concentration, the bigger the gap. It is thus understood that the separation regions 14 form with the useful volumes 16 a non-continuous 3D heterostructure.

The difference of energy levels in a separation region 14 and in a useful volume 16 forms a potential barrier. Thus, each separation region 14, thanks to a high cadmium concentration, forms a potential barrier in depth between two neighbouring useful volumes 16.

This potential barrier encloses minority carriers within a useful volume 16 of the useful layer. Each of the useful volumes 16 comprises a portion of the PN junction 10ab between the doped layers 10a and 10b, such that each useful volume 16 corresponds to a photodiode.

According to the prior art, starting from a stack of doped layers and wishing to form a photodiode array, pads each comprising a PN junction were separated, by etching of trenches in the stack. The basic idea of the invention is to separate pads each comprising a PN junction by placing potential barriers between these pads. Any step of etching to separate the pads is thus avoided. The drawbacks linked to etching are thus avoided. Furthermore, a so-called planar technology is still used, that is to say such that the useful layer has a substantially planar upper face. In other words, the useful layer does not have any large variation in the topography of its upper face. Planar technology simplifies subsequent steps, designated "packaging of components" (for example installation of electrical contact elements). This may be termed pixellisation of the useful layer 10.

As specified in the introduction, the etching to separate the pads is at the origin of a dark current in the photodiode, which the invention thus makes it possible to dispense with.

The invention further makes it possible to become free of the drawbacks inherent in mesa geometry, and particularly other deficiencies linked to the etching of mesa structures:
  minority carriers created in the useful layer in reaction to the absorption of a photon, may have a tendency to recombine at the level of the material deficiencies of the etched interface, and not after passing through a PN junction. In this case, an incident photon in the useful layer, and at the detection wavelength, will indeed cause the appearance of a minority carrier, but not that of a measurable current in a mesa photodiode. The optical properties of the mesa photodiode array are thus degraded;
  conversely, the presence of deficiencies linked to the etching of the mesa may induce the creation of minority carriers. For example, the presence of deficiencies in the depletion region of a photodiode is going to lead to the creation of minority carriers by a phenomenon of generation-recombination in the depletion region. These carriers are going to be at the origin of an electric current in the absence of a photonic flux. These deficiencies are thus going to increase the dark current of the photodiode and thus degrade the performances of the photodiode array. Phenomena other than generation-recombination, linked to these deficiencies, may be at the origin of an increase of the dark current.

Figure 2:
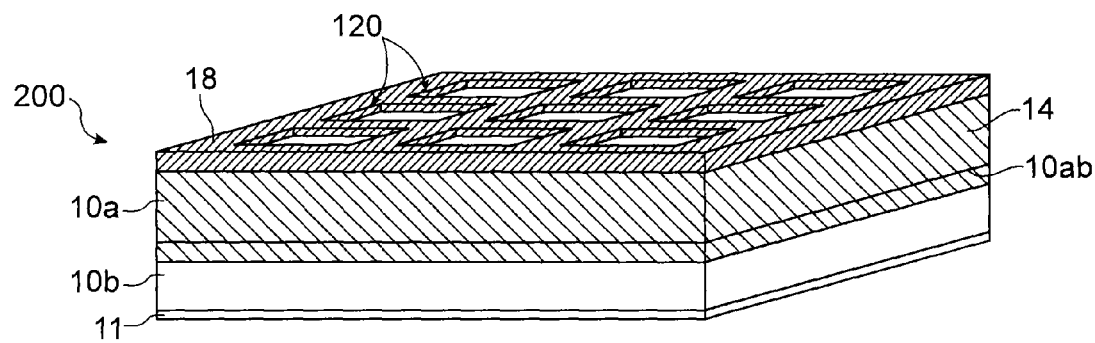
FIG. 2 illustrates according to a perspective view a first embodiment of a photodiode array according to the invention.

FIG. 2 is a perspective view of a photodiode array 200 obtained using the method of FIG. 1. The photodiode array 200 has a planar geometry.

In the example represented in FIG. 2, a single one-piece separation region 14 makes it possible to isolate all the useful volumes (not represented in FIG. 2). The openings 120 in the remaining layer 18, and thus the useful volumes, are spread out in the useful layer according to a regular lattice pattern, particularly a square lattice pattern. The term regular lattice pattern is used when all the patterns have the same shape and are regularly spaced out in space.

Figure 3:
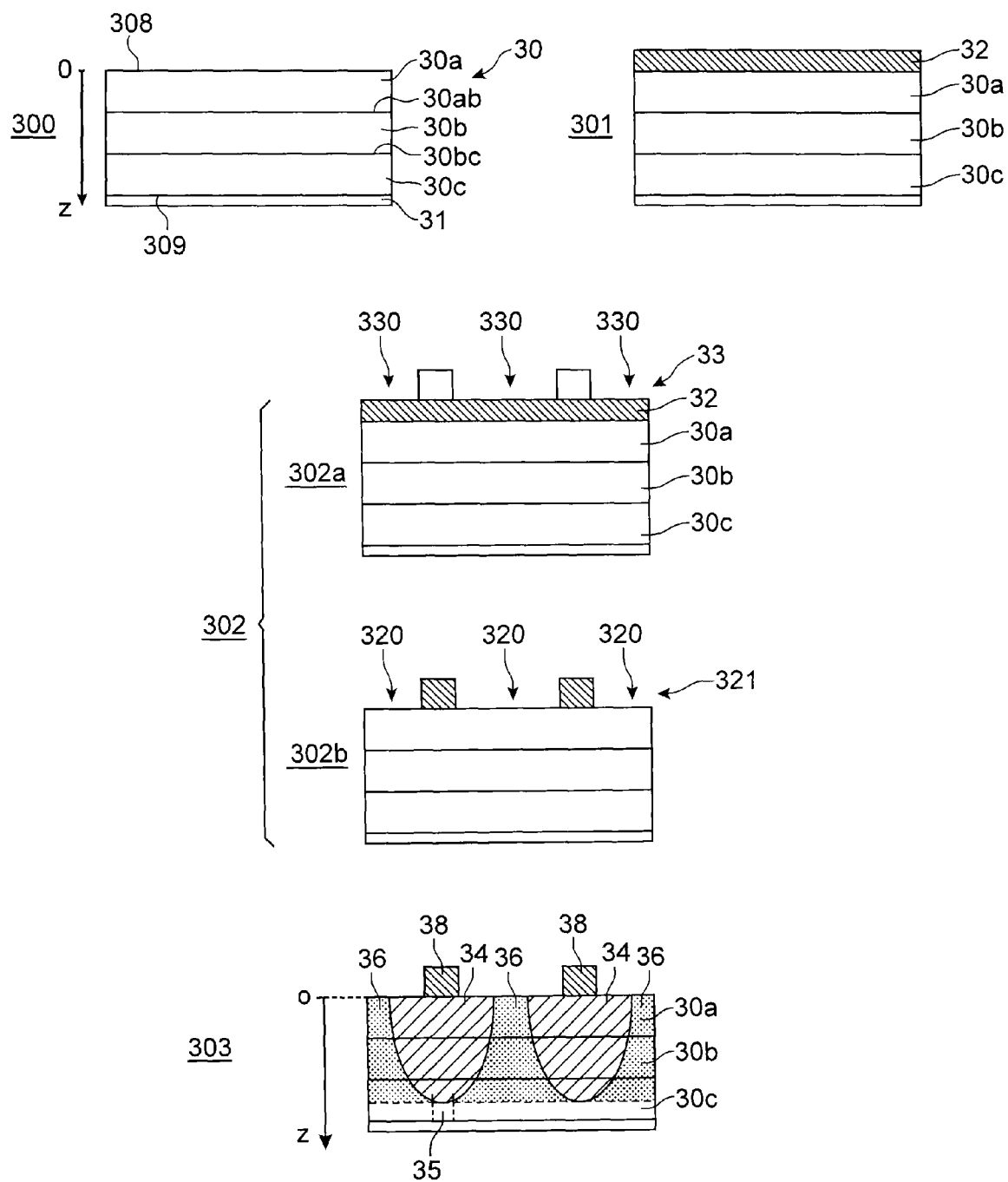
FIG. 3 illustrates in a schematic manner a second embodiment of the method according to the invention.

FIG. 3 illustrates a second embodiment of the method according to the invention. The numerical references of FIG. 3 correspond to the numerical references of FIG. 1, the first numeral of each number being replaced by a 3.

FIG. 3 will only be described for its differences with regard to FIG. 1.

The useful layer 30 formed at step 301 consists of a stack of three doped layers 30a, 30b and 30c, forming together the useful layer 30. The doped layers 30a and 30c each have an N or P doping, of different nature to that of the layer 30b. The interface 30ab between the doped layers 30a and 30b thus forms a first PN junction. The interface 30bc between the doped layers 30b and 30c forms a second PN junction.

The reservoir layer 32 has a cadmium concentration greater than the average cadmium concentration in the useful layer 30, the useful layer 30 being formed by the three doped layers 30a, 30b, 30c.

At the end of the diffusion annealing 303, separation regions 34 into which cadmium atoms have diffused are formed.

According to a first variant of the embodiment represented in FIG. 3, beyond a predetermined depth in the useful layer 10 corresponding to the depth of the PN junction 30bc, the average cadmium concentration in the separation regions 34 is greater than the average cadmium concentration in the useful volumes 36.

According to a second variant of the embodiment represented in FIG. 3, the average cadmium concentration in the separation regions 34 is greater than the average cadmium concentration in the useful volumes 36.

The separation regions 34 extend up to inside the doped layer 30c, going through the two PN junctions 30ab and 30bc. In particular, the separation regions 34 pass through the PN junction 30bc, which is the PN junction the closest to the lower face 309 of the useful layer 30. The doped layer 30c of FIG. 3 corresponds to the doped layer 10b of FIG. 1.

Figure 4:
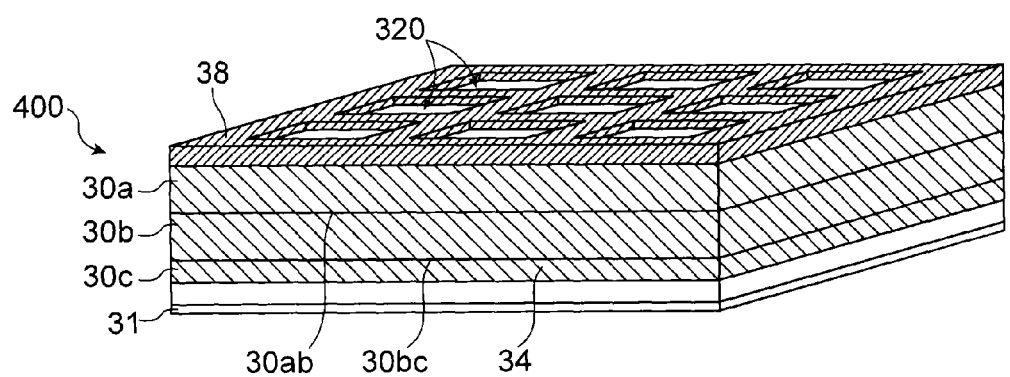
FIG. 4 illustrates according to a perspective view a second embodiment of a photodiode array according to the invention.

FIG. 4 is a perspective view of a photodiode array 400 obtained using the method of FIG. 3. It corresponds to the array 200 illustrated in FIG. 2, except that it has three doped layers instead of two. The upper doped layer 30a has a thickness of the order of 5 μm and an N doping having a doping density of the order of $10^{17}$ atoms/cm$^3$. The median doped layer 30b has a thickness of the order of 5 μm and a P doping having a doping density of the order of $10^{17}$ atoms/cm$^3$. The lower doped layer 30c has a thickness of the order of 10 μm and an N doping having a doping density of the order of 10$^{19}$ atoms/cm$^3$.

An advantage of such a photodiode array with three doped layers is that it forms a stack of two elementary arrays of elementary photodiodes positioned head to tail and sharing a same median doped layer 30b. There is thus a series of stacks of two photodiodes positioned head to tail, each stack of two photodiodes corresponding to a stack of two PN junctions positioned head to tail.

By biasing one or the other of the PN junctions 30ab or 30bc, one or the other of the elementary array of photodiodes is used. Advantageously, an upper doped layer 30a has a first cadmium concentration, which corresponds to the absorption of a first wavelength, and a lower doped layer 30c has a second cadmium concentration, which corresponds to the absorption of a second wavelength.

The biasing of the PN junctions takes place typically by means of:
- for each stack of two photodiodes, an electrical contact element electrically connected to the upper doped layer 30a; and
- an electrical contact element common to all the stacks of two photodiodes, electrically connected to the lower doped layer 30c.

By reverse biasing the PN junction between the upper doped layer 30a and the median doped layer 30b, incident photons are detected at the first wavelength. By reverse biasing the PN junction between the lower doped layer 30c and the median doped layer 30b, incident photons are detected at the second wavelength. A same structure makes it possible to detect two different wavelengths, which is why is it known as "bispectral photodiode array".

Typically, the lower doped layer 30c has a cadmium concentration defined by x=0.3 (detection in the MWIR), and the upper doped layer 30a has a cadmium concentration defined by x=0.22 (detection in the LWIR). The median doped layer 30b may have a cadmium concentration defined by x=0.7 (corresponding to the detection of radiation in the small wave infrared, around a wavelength of 1.5 μm). The order of the stack of layers is a function of their gap. Preferably the largest gap flanked between two layers of smaller gaps is provided.

Figure 5:
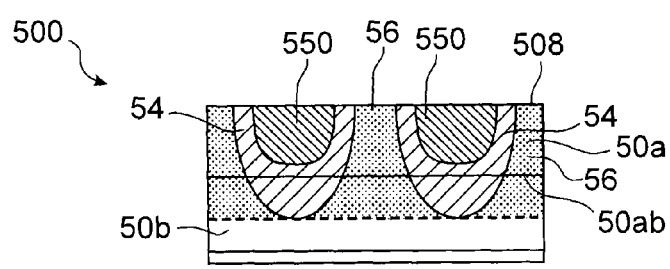
FIG. 5 illustrates according to a sectional view a third embodiment of a photodiode array according to the invention.

In FIG. 5 is illustrated a third embodiment of a photodiode array 500 according to the invention. The numerical references of FIG. 5 correspond to the numerical references of FIG. 1, the first numeral being replaced by a 5.

The photodiode array 500 according to the invention is obtained by the implementation of the steps of the method as described with reference to FIG. 1, followed by the following steps:
- deletion of the structured layer 521;
- local over-doping so as to form at least one over-doped zone 550 in the useful layer, situated both inside at least one separation region 54 and inside the upper doped layer 50a of the useful layer.

Each over-doped zone 550 is formed so as to be situated uniquely inside at least one separation region 54, that is to say in a region of the useful layer where cadmium atoms have diffused.

The upper doped layer 50a designates one of the superimposed doped layers forming together the useful layer. The upper doped layer 50a designates more particularly the doped layer comprising the upper face 508 of the useful layer. Each over-doped zone 550 is formed so as to be situated uniquely inside this upper doped layer 50a.

Thus, each over-doped zone 550 is formed so as to be situated inside a region formed by the intersection between the upper doped layer 50a and a separation region 54.

An over-doped zone 550 may extend over the whole of a region formed by the intersection between the upper doped layer 50a and a separation region 54. In a variant, an over-doped zone 550 may extend over only a part of the region formed by the intersection between the upper doped layer 50a and a separation region 54.

Each over-doped zone 550 has a doping of different nature to that of the doping of the upper doped layer 50a. For example, for an upper doped layer doped N, the over-doped zone 550 has a P type doping. Conversely, for an upper doped layer doped P, the over-doped zone 550 has an N type doping. Each over-doped zone 550 preferably has a doping level at least ten times greater than that of the upper doped layer 50a.

In the case where the upper doped layer is N doped, an over-doped zone 550 may be formed by diffusion or implantation of P doping atoms such as arsenic or phosphorus atoms. If necessary, an activation annealing is then carried out.

In the case where the upper doped layer is P doped, an over-doped zone 550 may be formed by diffusion or implantation of N doping atoms such as boron or indium atoms. If necessary, an activation annealing is then carried out.

A photodiode array 500 is thus formed, which forms an advantageous variant of the photodiode array as illustrated in FIG. 2.

The at least one over-doped zone 550 makes it possible to increase locally the gap value in the useful layer, in the vicinity of the separation regions. The potential barrier formed by the separation regions 54 is thus reinforced.

The photodiode array thereby obtained thus has a further reduced dark current. It has also a further improved MTF.

In the same way could be realised a variant of the second embodiment of a method and of a photodiode array, illustrated in FIGS. 3 and 4.

The invention is not limited to the examples that have been described, and numerous variants could be imagined, without going beyond the scope of the present invention. For example, the useful layer may have, before formation of a structured layer, a higher cadmium concentration over a certain thickness on the side of its upper face. The separation regions may have a particular doping.

The invention claimed is:

1. A planar photodiode array comprising a useful layer made of a cadmium, mercury and tellurium semi-conductor alloy of $Cd_xHg_{1-x}Te$ type, the useful layer having a lower face and an upper face on the side opposite to the lower face; wherein:
   the useful layer comprises at least two superimposed doped layers, each interface between two adjacent doped layers forming a PN junction which extends over the whole extent of the useful layer;
   the useful layer has at least one region designated separation region, extending from the upper face of the useful layer towards the lower face while going through said PN junction, the separation region separating at least two volumes, designated useful volumes which extend into the useful layer as deeply as the separation region; and
   the average cadmium concentration in the separation region is greater than the average cadmium concentration in a remainder of the useful layer.

2. The photodiode array according to claim 1, wherein the useful layer consists of two doped layers each having a doping of different nature.

3. The photodiode array according to claim 1, wherein the useful layer consists of three doped layers forming together two PN junctions, two doped layers having a doping of same nature flanking a median doped layer having a doping of different nature, and the separation region passing through the two PN junctions.

4. The photodiode array according to claim 1, wherein the separation region has a cadmium gradient decreasing from the upper face of the useful layer and in the direction of its lower face.

5. The photodiode array according to claim 1, wherein the separation region is separated from the lower face of the useful layer by at least one portion of said useful layer.

6. The photodiode array according to claim 1, wherein the useful volumes are spread out in the useful layer according to a regular lattice pattern.

7. The photodiode array according to claim 6, wherein the useful volumes are spread out in the useful layer according to a square lattice pattern, and separated from each other by a single separation region.

8. The photodiode array according to claim 1, comprising at least one over-doped zone, situated in a region formed by the intersection between a separation region and the doped layer situated on the side of the upper face of the useful layer, designated upper doped layer, the over-doped zone having a doping of type opposite to that of said upper doped layer.

* * * * *